(12) United States Patent
Foo

(10) Patent No.: US 7,693,667 B2
(45) Date of Patent: Apr. 6, 2010

(54) METHOD AND SYSTEM FOR DETERMINING A PREDICTED FLASH ENDURANCE VT OF A FLASH CELL AFTER N PROGRAM/ERASE CYCLES

(75) Inventor: Eu Gene Glen Foo, Singapore (SG)

(73) Assignee: Systems on Silicon Manufacturing Co. Pte. Ltd., Singapore (SG)

(*) Notice: Subject to any disclaimer, the term of this patent is extended or adjusted under 35 U.S.C. 154(b) by 683 days.

(21) Appl. No.: 11/563,088

(22) Filed: Nov. 24, 2006

(65) Prior Publication Data

US 2008/0126000 A1 May 29, 2008

(51) Int. Cl.
*G06F 19/00* (2006.01)
*G11C 16/04* (2006.01)

(52) U.S. Cl. ............. 702/34; 702/117; 365/185.11; 365/185.33

(58) Field of Classification Search ............. 702/34, 702/117; 365/185.11, 185.23, 185.33
See application file for complete search history.

(56) References Cited

U.S. PATENT DOCUMENTS 7,110,302 B2 * 9/2006 Lee et al. ............. 365/185.33

* cited by examiner

*Primary Examiner*—Bryan Bui
(74) *Attorney, Agent, or Firm*—Rothwell, Figg, Ernst & Manbeck, P.C.

(57) ABSTRACT

A method and system for determining a predicted flash endurance Vt of a flash cell after N program/erase cycles. The method includes measuring a Vtp value and a Vte value of the flash cell after a cycle number in a range from 2000 to less than N/2 program/erase cycles; calculating a Vtp slope of a line starting from the measured Vtp value in a half logarithmic graph representation based on historical test data from flash cells of wafers having substantially the same process steps compared to the flash cell under investigation; calculating a Vte slope of a line starting from the measured Vte value in a half logarithmic graph representation based on the historical test data; and determining the Vtp and Vte values at 2 million program/erase cycles by extrapolating from the measured Vte and Vtp values.

11 Claims, 9 Drawing Sheets

METHOD AND SYSTEM FOR DETERMINING A PREDICTED FLASH ENDURANCE VT OF A FLASH CELL AFTER N PROGRAM/ERASE CYCLES

FIELD OF INVENTION

The present invention relates broadly to a method and system for determining a predicted flash endurance Vt of a flash cell after N program/erase cycles, and to a data storage medium having stored thereon computer code means for instructing a computer to execute a method of determining a predicted flash endurance Vt of a flash cell after N program/erase cycles.

BACKGROUND

In wafer fabrication technology, two tests are typically performed to determine intrinsic flash cell performance for flash technology qualification. As a first part, a single cell endurance threshold voltage, Vt window closure test is performed, hereinafter referred to as Endu test, and secondly a charged pump characterization test is performed, hereinafter referred to as CP test. As part of the Endu test, up to two million program/erase cycles are performed on a flash cell. After the two million cycles, Vtp (Vt after programming) and Vte (Vt after erase) are measured, and Vtp (2 mil)–Vte (2 mil) is calculated. For the CP test, a flash cell is subjected to one million program/erase cycles. After the one millionth cycle, Icp, pk (peak charge pump current) is measured, and the charge trapped after program (Ctp) is calculated from the measured Icp, pk.

The above described intrinsic flash cell performance test has a number of problems, including a significant time investment to perform the relevant program/erase cycles. For example, it typically takes two weeks to run two million program/erase cycles for the Endu test and it may typically take 1.5 weeks to run the one million program/erase cycles for the CP test. This results in a total lead time of about 3.5 weeks. Furthermore, for the Endu test, defects induced breakdown may be encountered, and typically occurs between 50,000 to 300,000 cycles. If defects induced breakdown occurs, then the test needs to restart, causing further substantial delay.

A need therefore exists to provide a method and system that seeks to address at least one of the above problems.

SUMMARY

In accordance with a first aspect of the present invention there is provided a method of determining a predicted flash endurance Vt of a flash cell after N program/erase cycles, the method comprising the steps of determining a pair of Ctp or Cte values of the flash cell at different respective cycle numbers in a range from 2000 to less than N program/erase cycles; determining a Ctp or Cte slope, R, of a line between the pair of Ctp or Cte values in a half logarithmic graph representation; measuring a Vtp value and a Vte value of the flash cell after a cycle number in a range from 2000 to less than N/2 program/erase cycles; calculating a Vtp slope, S, of a line starting from the measured Vtp value in a half logarithmic graph representation based on a first transformation function describing a relationship between an average of Ctp and Cte slopes and an average of Vtp slopes of historical test data from flash cells of wafers having substantially the same process steps compared to the flash cell under investigation; calculating a Vte slope, S', of a line starting from the measured Vte value in a half logarithmic graph representation based on R and a second transformation function describing a relationship between an average of Ctp and Cte slopes and an average of Vte slopes of the historical test data; and determining the Vtp and Vte values at 2 million program/erase cycles by extrapolating from the measured Vte and Vtp values using S and S' respectively in half logarithmic graph representations.

The step of determining the pair of Ctp or Cte values of the flash cell may comprise measuring Icp_e or Icp_p respectively as a function of Vbase of the flash cell.

The step of determining the Ctp or Cte slope, R, may comprise using a first logarithmic function and substituting the measured pair of Ctp or Cte values to calculate parameters of the first logarithmic function.

The step of determining the Vtp and Vte values may comprise using a second logarithmic function and substituting the calculated S and the measured Vtp to calculate parameters of the second logarithmic function; and using a third logarithmic function and substituting the calculated S' and the measured Vte to calculate parameters of the second logarithmic function.

The first transformation function may comprise a ratio of the average of the Ctp and Cte slopes and the average of the Vtp slopes of historical test data, and the second transformation function comprises a ratio of the average of the Ctp and Cte slopes and the average of the Vte slopes of historical test data.

In accordance with a second aspect of the present invention there is provided a system for determining a predicted flash endurance Vt of a flash cell after N program/erase cycles, the system comprising a first measurement unit for determining a pair of Ctp or Cte values of the flash cell at different respective cycle numbers in a range from 2000 to less than N program/erase cycles; a processing unit for determining a Ctp or Cte slope, R, of a line between the pair of Ctp or CTe values in a half logarithmic graph representation; a second measurement unit for measuring a Vtp value and a Vte value of the flash cell after a cycle number in a range from 2000 to less than N/2 program/erase cycles; wherein the processing unit calculates a Vtp slope, S, of a line starting from the measured Vtp value in a half logarithmic graph representation based on a first transformation function describing a relationship between an average of Ctp and Cte slopes and an average of Vtp slopes of historical test data from flash cells of wafers having substantially the same process steps compared to the flash cell under investigation; calculates a Vte slope, S', of a line starting from the measured Vte value in a half logarithmic graph representation based on R and a second transformation function describing a relationship between an average of Ctp and Cte slopes and an average of Vte slopes of the historical test data; and determines the Vtp and Vte values at 2 million program/erase cycles by extrapolating from the measured Vte and Vtp values using S and S' respectively in half logarithmic graph representations.

The first measurement unit may measure Icp_e or Icp_p respectively as a function of Vbase of the flash cell.

The processing unit, in determining the Ctp or Cte slope, R, may use a first logarithmic function and substituting the measured pair of Ctp or Cte values to calculate parameters of the first logarithmic function.

The processing unit, in determining the Vtp and Vte values, may use a second logarithmic function and substituting the calculated S and the measured Vtp to calculate parameters of the second logarithmic function; and uses a third logarithmic function and substituting the calculated S' and the measured Vte to calculate parameters of the second logarithmic function.

The first transformation function may comprise a ratio of the average of the Ctp and Cte slopes and the average of the Vtp slopes of historical test data, and the second transformation function comprises a ratio of the average of the Ctp and Cte slopes and the average of the Vte slopes of historical test data.

In accordance with a third aspect of the present invention there is provided a data storage medium having stored thereon computer code means for instructing a computer to execute a method of determining a predicted flash endurance Vt of a flash cell after N program/erase cycles, the method comprising the steps of determining a pair of Ctp or Cte values of the flash cell at different respective cycle numbers in a range from 2000 to less than N program/erase cycles; determining a Ctp or Cte slope, R, of a line between the pair of Ctp or CTe values in a half logarithmic graph representation; measuring a Vtp value and a Vte value of the flash cell after a cycle number in a range from 2000 to less than N/2 program/erase cycles; calculating a Vtp slope, S, of a line starting from the measured Vtp value in a half logarithmic graph representation based on a first transformation function describing a relationship between an average of Ctp and Cte slopes and an average of Vtp slopes of historical test data from flash cells of wafers having substantially the same process steps compared to the flash cell under investigation; calculating a Vte slope, S', of a line starting from the measured Vte value in a half logarithmic graph representation based on R and a second transformation function describing a relationship between an average of Ctp and Cte slopes and an average of Vte slopes of the historical test data; and determining the Vtp and Vte values at 2 million program/erase cycles by extrapolating from the measured Vte and Vtp values using S and S' respectively in half logarithmic graph representations.

BRIEF DESCRIPTION OF THE DRAWINGS

Embodiments of the invention will be better understood and readily apparent to one of ordinary skill in the art from the following written description, by way of example only, and in conjunction with the drawings, in which.

DETAILED DESCRIPTION

Figure 1:
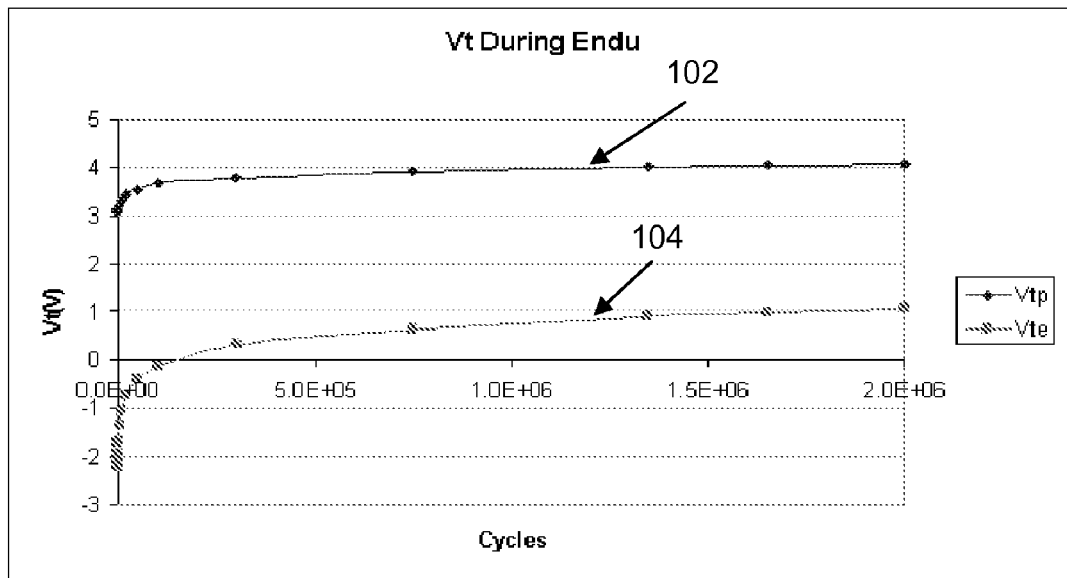
FIG. 1 shows a graph of intermediate Vtp and Vte measurements between zero and two million cycles.

The described intrinsic flash cell performance assessment technique can replace the full Endu test and CP test based assessment. The described technique can reduce test time to about 20 minutes using a three-point measurement. The described assessment technique is based on having identified new Endu type and CP-type test models and characterizations, and on generating new transformation functions to relate test parameters from the endu-type and CP-type tests for predicting the flash endurance Vt values.

Some portions of the description which follows are explicitly or implicitly presented in terms of algorithms and functional or symbolic representations of operations on data within a computer memory. These algorithmic descriptions and functional or symbolic representations are the means used by those skilled in the data processing arts to convey most effectively the substance of their work to others skilled in the art. An algorithm is here, and generally, conceived to be a self-consistent sequence of steps leading to a desired result. The steps are those requiring physical manipulations of physical quantities, such as electrical, magnetic or optical signals capable of being stored, transferred, combined, compared, and otherwise manipulated.

Unless specifically stated otherwise, and as apparent from the following, it will be appreciated that throughout the present specification, discussions utilizing terms such as "calculating", "determining", "generating", "measuring", or the like, refer to the action and processes of a computer system, or similar electronic device, that manipulates and transforms data represented as physical quantities within the computer system into other data similarly represented as physical quantities within the computer system or other information storage, transmission or display devices.

The present specification also discloses apparatus for performing the operations of the methods. Such apparatus may be specially constructed for the required purposes, or may comprise a general purpose computer or other device selectively activated or reconfigured by a computer program stored in the computer. The algorithms and displays presented herein are not inherently related to any particular computer or other apparatus. Various general purpose machines may be used with programs in accordance with the teachings herein. Alternatively, the construction of more specialized apparatus to perform the required method steps may be appropriate. The structure of a conventional general purpose computer will appear from the description below.

In addition, the present specification also implicitly discloses a computer program, in that it would be apparent to the person skilled in the art that the individual steps of the method described herein may be put into effect by computer code. The computer program is not intended to be limited to any particular programming language and implementation thereof. It will be appreciated that a variety of programming languages and coding thereof may be used to implement the teachings of the disclosure contained herein. Moreover, the computer program is not intended to be limited to any particular control flow. There are many other variants of the computer program, which can use different control flows without departing from the spirit or scope of the invention.

Figure 2:
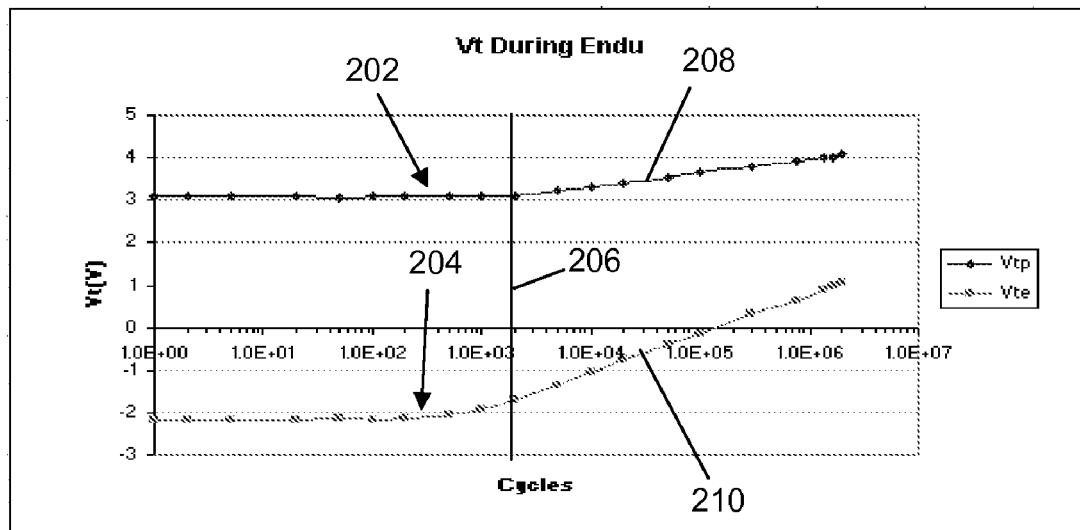
FIG. 2 shows a half-logarithmic plot of the data of FIG. 1.

With reference to FIGS. 1 and 2, Vtp and Vte intermediate read outs between 0 and 2 million cycles were performed, as shown in graphs 102, 104 and 202, 204 in FIGS. 1 and 2 respectively. From the graphs shown in FIGS. 1 and 2, the inventors have identified that Vtp and Vte behave bimodal and fit into a Log equation after about 2000 cycles. More particular, and with reference to the graph shown in FIG. 2, the transition point at about 2000 cycles, indicated by vertical line 206 has been identified, with a Log equation-type behavior, beyond the transition point 206 as illustrated by the linearly sloping curve portions 208, 210 in the half logarithmic graph in FIG. 2.

Figure 3:
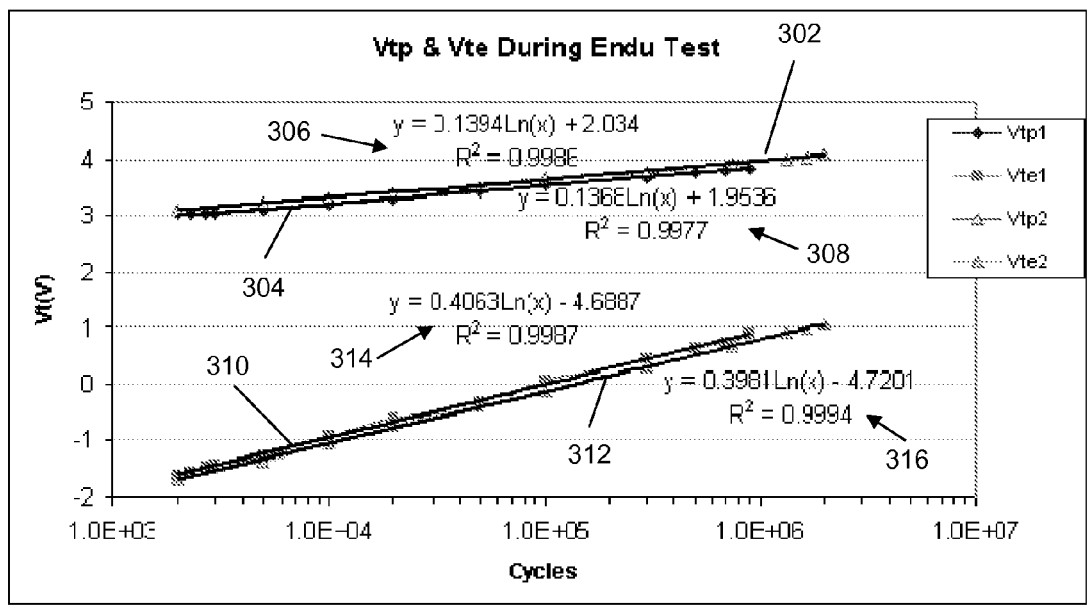
FIG. 3 shows plots of intermediate Vtp and Vte measurements between zero and two million cycles on a half-logarithmic graph for different batches.

The Log relationship was confirmed and its reproducibility identified, as illustrated in the graph shown in FIG. 3. More particular, in the graph shown in FIG. 3, the Vtp curves 302, 304 for two different batches were plotted and fitted with respective Log equations 306, 308 respectively. R2 values of 0.9986 and 0.9977 were obtained for the fitting of the curves 302, 304 respectively, confirming the good Log relationship recognized by the inventors. Furthermore, the reproducibility between the different batches used for curves 302, 304 respectively is indicated by the closeness of the Log slopes between the batches.

Similarly, curves 310 and 312 show Log equation fits for Vte measurements after 2000 cycles for the same different batches. Again, Log equations 314, 316 were fitted to the measured data points respectively, with R2 values of 0.9987 and 0.9994 respectively, again confirming the good Log relationship, and the reproducibility is confirmed through the closeness of the slopes of the curves 310, 312 between the different batches.

Figure 4:
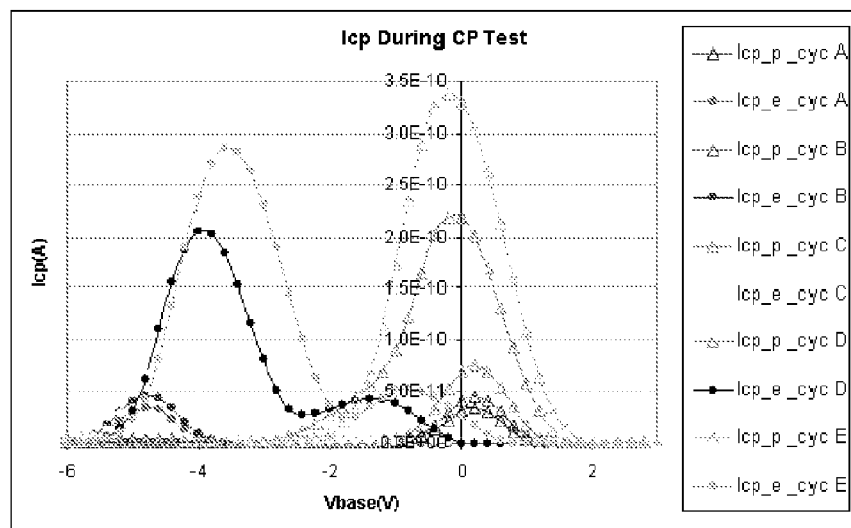
FIG. 4 shows plots of intermediate Icp_p and Icp_e measurements between zero and one million cycles.

Next, the modified CP test set up and model used in the described assessment technique will be described with reference to FIGS. 4 to 6. In the described assessment technique, both Icp_p (charge pump current, program) and Icp_e (charge pump current, erase) are measured as a function of Vbase. The graph in FIG. 4 shows the respective measurement curves, where cycles A to E represent measurements after increasing cycle numbers between 0 and 1 million cycles. This is in contrast to the existing CP test model and setup, where only Icp_p is measured as a function of Vbase. During those measurements, the source and drain of the flash cell are tied together, and the gate has a constant 5V pulse train at 500 Khz applied to the transistor. Icp is the total source and drain current being measured during the sweep of Vbase, with Vbase the voltage applied to the tied source and drain.

Figure 5:
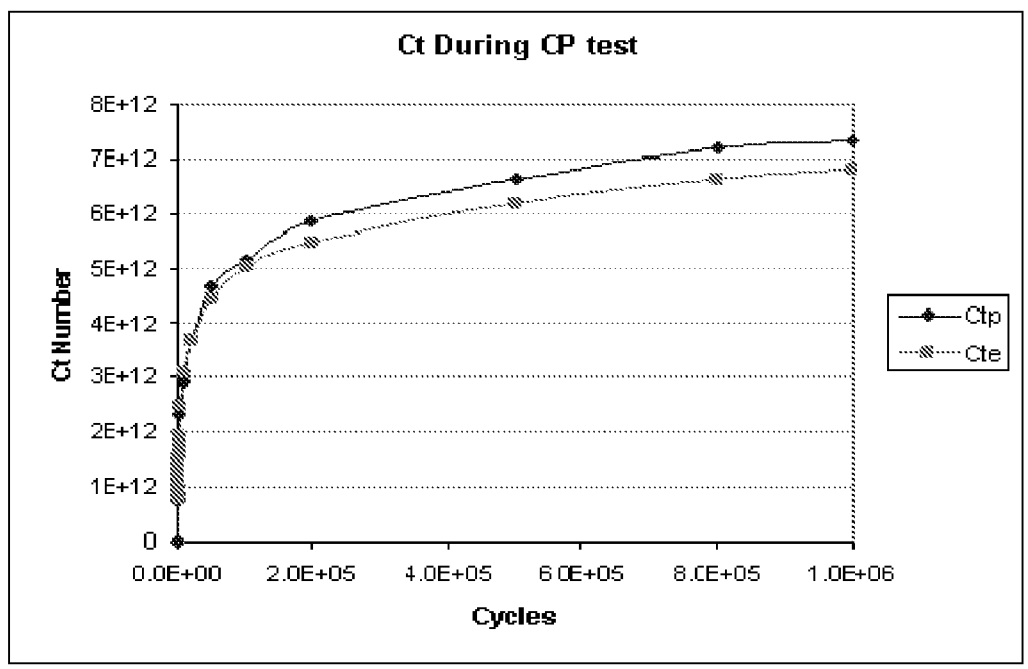
FIG. 5 shows plots of calculated intermediate Ctp and Cte values between zero and one million cycles based on the plots shown in FIG. 4.
Figure 6:
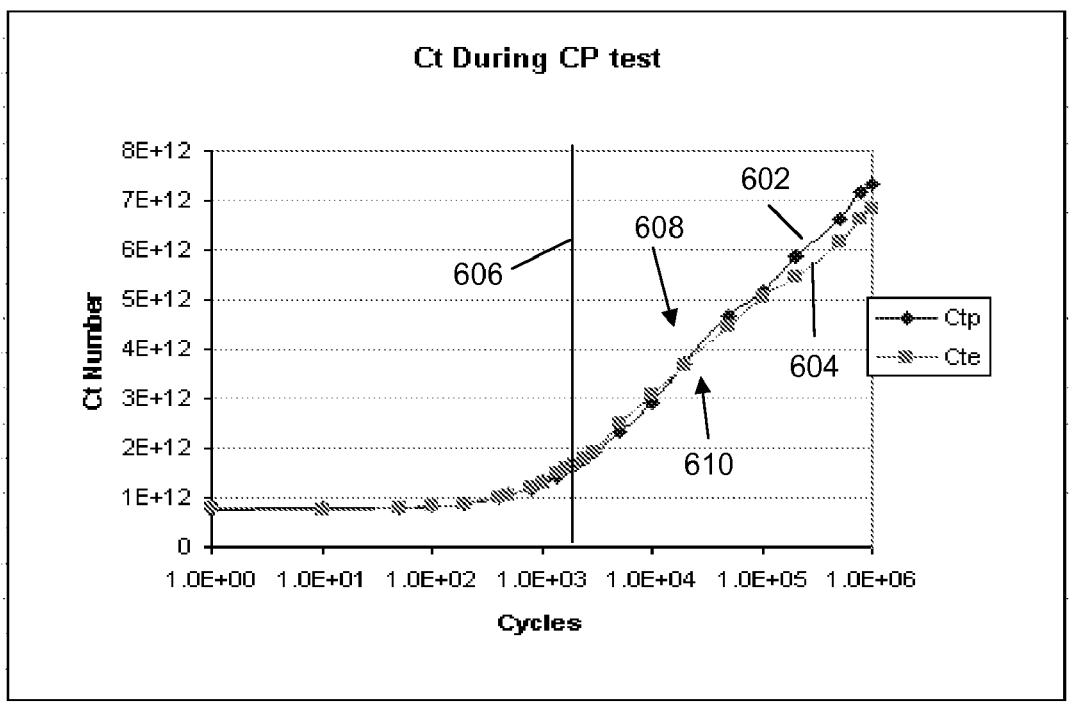
FIG. 6 shows a half-logarithmic plot of the data of FIG. 5.

From the measured curves for Icp_p and Icp_e shown in the graph in FIG. 4, the Ctp and the charge trapped after erase (Cte) are calculated, and the intermediate readouts between 0 and 1 million cycles plotted as a function of cycle number, as shown in the graph shown in FIG. 5. The Ct values are calculated based on the following equation:

$$Ct = Icp,pk/(q*f*A),$$

where q is the electron charge (about $1.6e^{-19}$ C), f is the frequency (500 kHz), and A is the test transistor area (about $6 \times 10^{-10}$ cm$^2$), where Ct is provided in states/(cm$^2$.eV).

The inventors have recognized that Ctp and Cte values are bimodal and fit into respective Log equations after about 2000 cycles. For illustration, FIG. 6 shows the curves 602, 604 for Ctp and Cte respectively in a half logarithmic graph, where the transition point at about 2000 cycles is indicated as a vertical line 606. Beyond the transition point 606, the curve portions 608, 610 for the Ctp and Cte values respectively show a linear slope in the half logarithmic graph.

Figure 7:
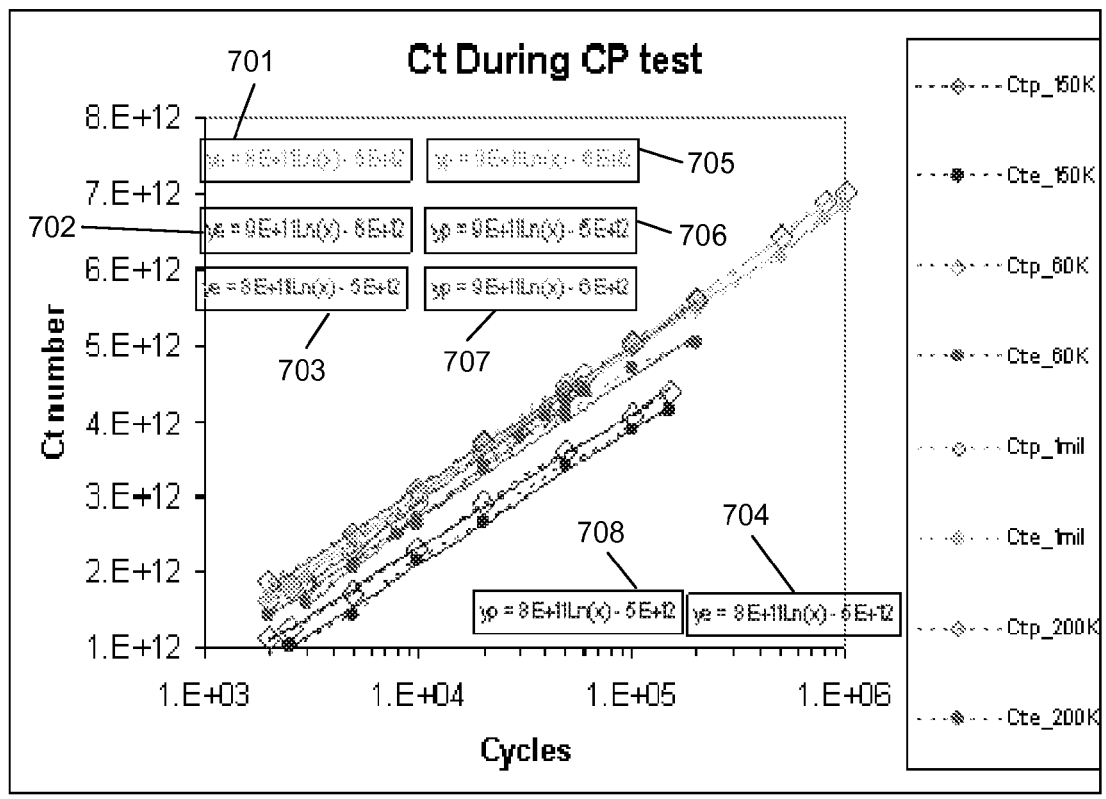
FIG. 7 shows plots of intermediate Ct values between zero and one million cycles on a half-logarithmic graph for different batches.
Figure 8:
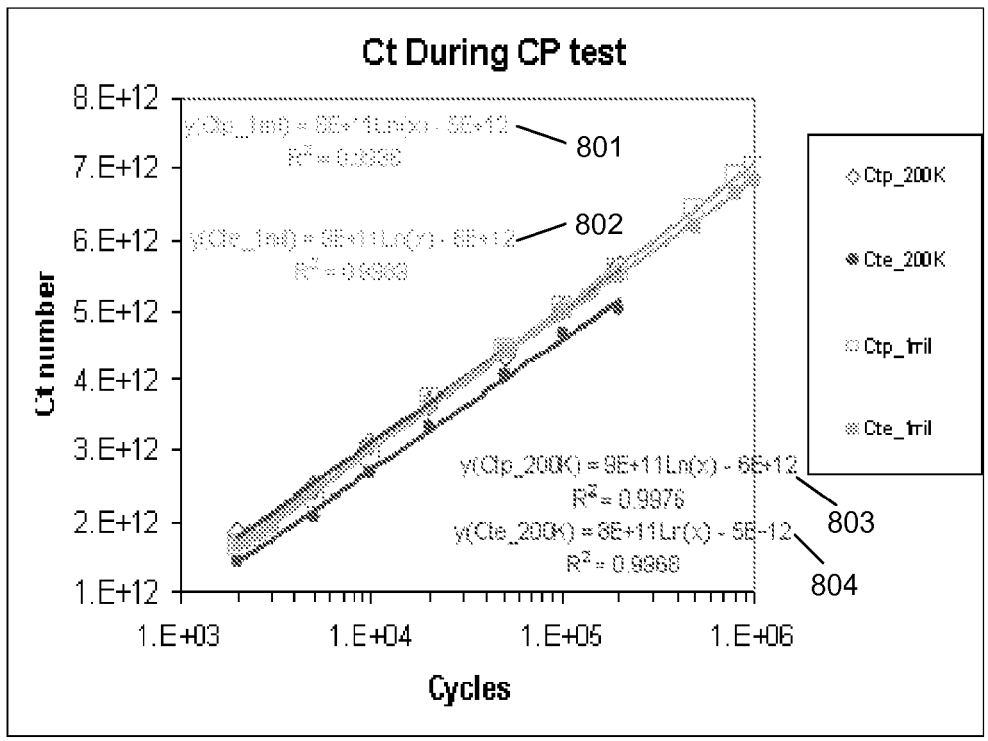
FIG. 8 shows selected ones of the plots shown in FIG. 7.

The Log relationship was confirmed for a number of different batches, and fitted curves to the respective Ct values are shown in the graph shown in FIG. 7. In FIG. 7, the fitted Log equations are provided at numerals 701 to 708 for the respective Ctp and Cte curves. The graph in FIG. 8 shows a selection of the curves shown in FIG. 7, together with the R$^2$ values for the respective Log equation fits at 801 to 804. The good R$^2$ values (greater than 0.99) and the closeness of the slopes of the respective curves confirm the good Log relationship and reproducibility of the identified CP test model of the described assessment technique.

From the data obtained from different batches, the described assessment technique extract the following values for use in the prediction of the flash endurance Vt:

From the CP test Log plots in FIG. 7, a slope average, Q, from all the Ctp and Cte Log fit equations 701 to 708.

From the endu-type test Log plots in FIG. 3, the slope average, P, of Vtp is calculated. Similarly, from the endu-type test Log plots in FIG. 3, the slope average, P', of Vte is calculated.

In the described assessment technique, the inventors have developed a transformation function F (Ct->Vtp)=P/Q, and F' (Ct->Vte)=P'/Q.

Figure 9:
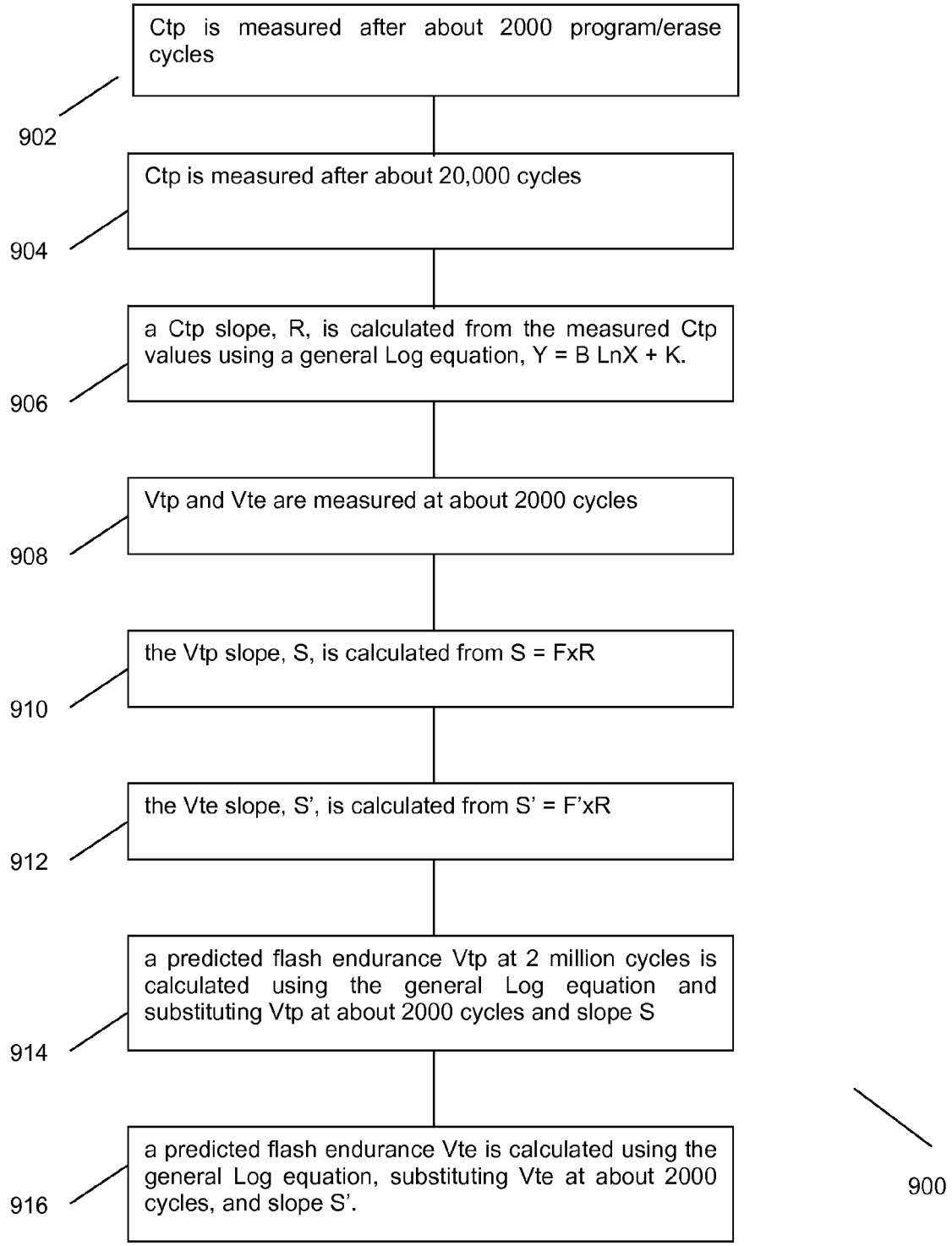
FIG. 9 shows a flowchart illustrating the measurements on a Wlf to be assessed.

FIG. 9 shows a flowchart 900 illustrating a measurement on a wafer in the described assessment technique. At step 902, Ctp is measured after about 2000 program/erase cycles. At step 904, Ctp is measured after about 20,000 cycles. At step 906, a Ctp slope, R, is calculated from the measured Ctp values using a general Log equation, Y=B LnX+K.

At step 908, Vtp and Vte are measured at about 2000 cycles. At step 910, the Vtp slope, S, is calculated from S=F*R. At step 912, the Vte slope, S', is calculated from S'=F'*R.

At step 914, a predicted flash endurance Vtp at 2 million cycles is calculated using the general Log equation and substituting Vtp at about 2000 cycles and slope S. At step 916, a predicted flash endurance Vte is calculated using the general Log equation, substituting Vte at about 2000 cycles, and slope S'.

Table 1 shows the actual data from the historical data described above with reference to FIGS. 3 and 7.

TABLE 1

| | |
|---|---|
| Charge trap Ct slope | 8.5e11 |
| Endurance Vtp slope P | 0.1381 |
| Endurance Vte slope P' | 0.4022 |
| F = P/Q | 1.62e-13 |
| F' = P'/Q' | 4.73e-13 |

Figure 10:
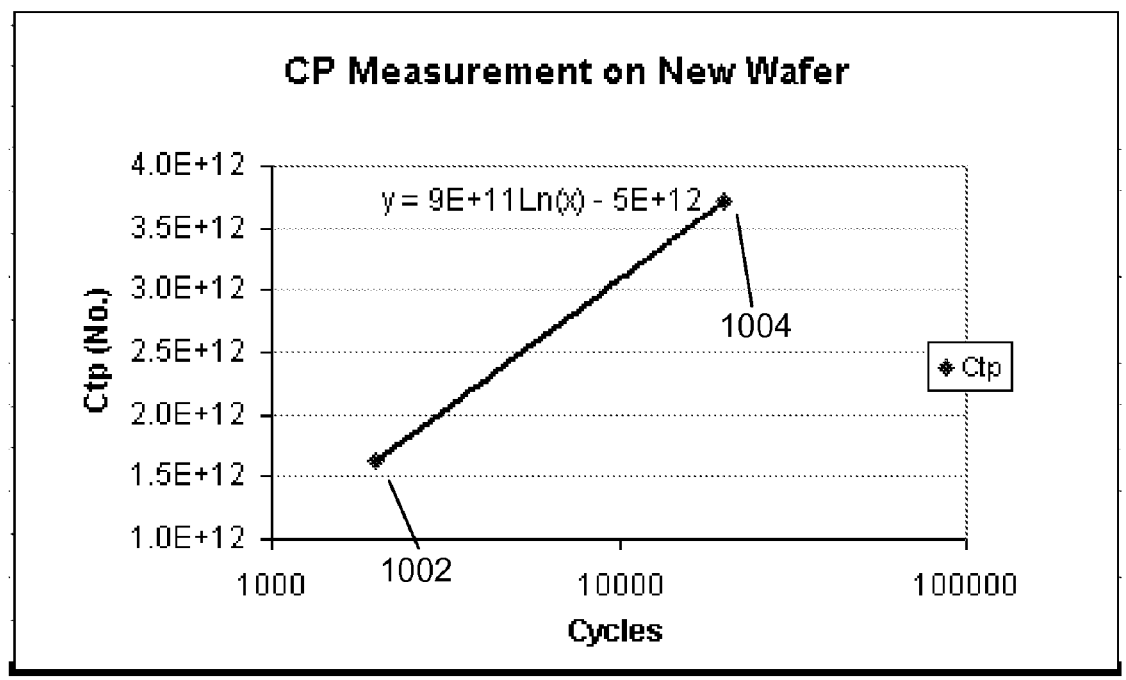
FIG. 10 shows a plot on a half-logarithmic graph of a logarithmic function derived based on the measurements of FIG. 9.

Table 2 summarizes the 3 points measurement conducted on a new Wlf in accordance with the described assessment technique, while FIG. 10 shows the general Log equation derived from the measurement points 1002, 1004 at 2000, 20000 cycles respectively. The corresponding Log equation is indicated at numeral 1006.

TABLE 2

| | |
|---|---|
| 2000 | 1.63e12 |
| 20000 | 3.71e12 |
| Ctp slope R | 9.00e11 |

Table 3 shows the Vtp and Vte values measured after 2000 cycles in the described assessment technique. Also shown in Table 3 are the values for the calculated slope S, the calculated slope S', as well as the calculated Kp value, the calculated Ke value, the predicted Vtp at 2 million cycles value, and the predicted Vte value at 2 million cycles.

TABLE 3

| Program/erase Cycles | Vtp | Vte |
|---|---|---|
| 2000 | 3.15 | −1.59 |
| Vtp slope S = FXR | 1.46e−01 | NA |
| Vte slope S' = F'XR | NA | 4.26e−01 |
| Calculate Kp & Ke | Y = SLnX + Kp | Y = S'LnX + Ke |
| | Y = SLnX + Kp | Y = S'LnX + Ke |
| | Kp = Y − SLn(X) | Ke = Y − S'Ln(X) |
| | Kp = 2.04 | Ke = −4.82 |
| Predicted Vt at 2 million cycles | 4.16 | 1.36 |

For comparison, Table 4 shows confirmation data obtained from the new Wlf, in particular the measured Vtp values and the measured Vte values after different cycle numbers, and including after 2 million cycles. The Vtp percentage error at 2 million cycles between the data in Table 4 and the predicted values in Table 3 were 0.76% and 3.52% for Vtp and Vte respectively.

TABLE 4

| Readouts | Program/erase Cycles | Vtp | Vte |
|---|---|---|---|
| Intermediate readouts measured before final 2 million cycles | 2K | 3.15 | −1.59 |
| | 10K | 3.31 | −1.06 |
| | 100K | 3.66 | −0.14 |
| | 500K | 3.91 | 0.65 |
| | 1 million | 4.02 | 0.96 |
| | 1.5 million | 4.06 | 1.15 |
| Final readout measured | 2 million | 4.13 | 1.31 |
| Vt error @ 2 million cycles between measured and predicted values (%) | | 0.76 | 3.52 |

The described assessment technique has application for line issues that need quick data to provide confidence and assurance to customers. Furthermore, pre-qualification and process changes, (especially with many splits) that require rough assessment and yet ideally utilize minimum testing resources are also application fields of the described assessment technique.

In the described assessment technique, the inventors have recognized that Ctp and Cte from the CP-type test are bimodal with a logarithmic relationship after 2000 program/erase cycles. Furthermore, the inventors have recognized that the Ctp and Cte rate of increase in the logarithmic relationship is equivalent. This implies that the underlying mechanism is the same for program and erase voltage and duration. As a result, a combined average slope, Q, can be extracted from the Ctp and Cte data, and a new wafer's measured Ctp, or Cte, at 2000 and e.g. 20000 cycles can be sufficient to predict both Vtp and Vte.

In the CP-type test in the described assessment technique, only uniform electron interface state (IS) formation is measured. Therefore, it is believed that the shift in Vt is purely due to IS formation and not other trapped charges, such as oxide trapped charges, drain-gate edge trapped charges or a combination of IS and others.

The inventors have recognized that the logarithmic slopes after 2000 program/erased cycles in the described assessment technique are insensitive to batch variation, for wafers which have similar process steps applied to them. This implies that the mechanism that induces Vtp/Vte shifts during endurance testing is intrinsically consistent regardless of batch variation under those circumstances.

In the historical data considered in the described assessment technique, the statistical fit, R2, of the respective logarithmic relationship functions is greater than 0.99 for each measurement. At the same time, the slopes of the logarithmic relationship in a half logarithmic presentation were less than 20% between different batches. These criteria may be utilized to assess the suitability of a particular set of historical data for application in the described assessment technique.

Figure 11:
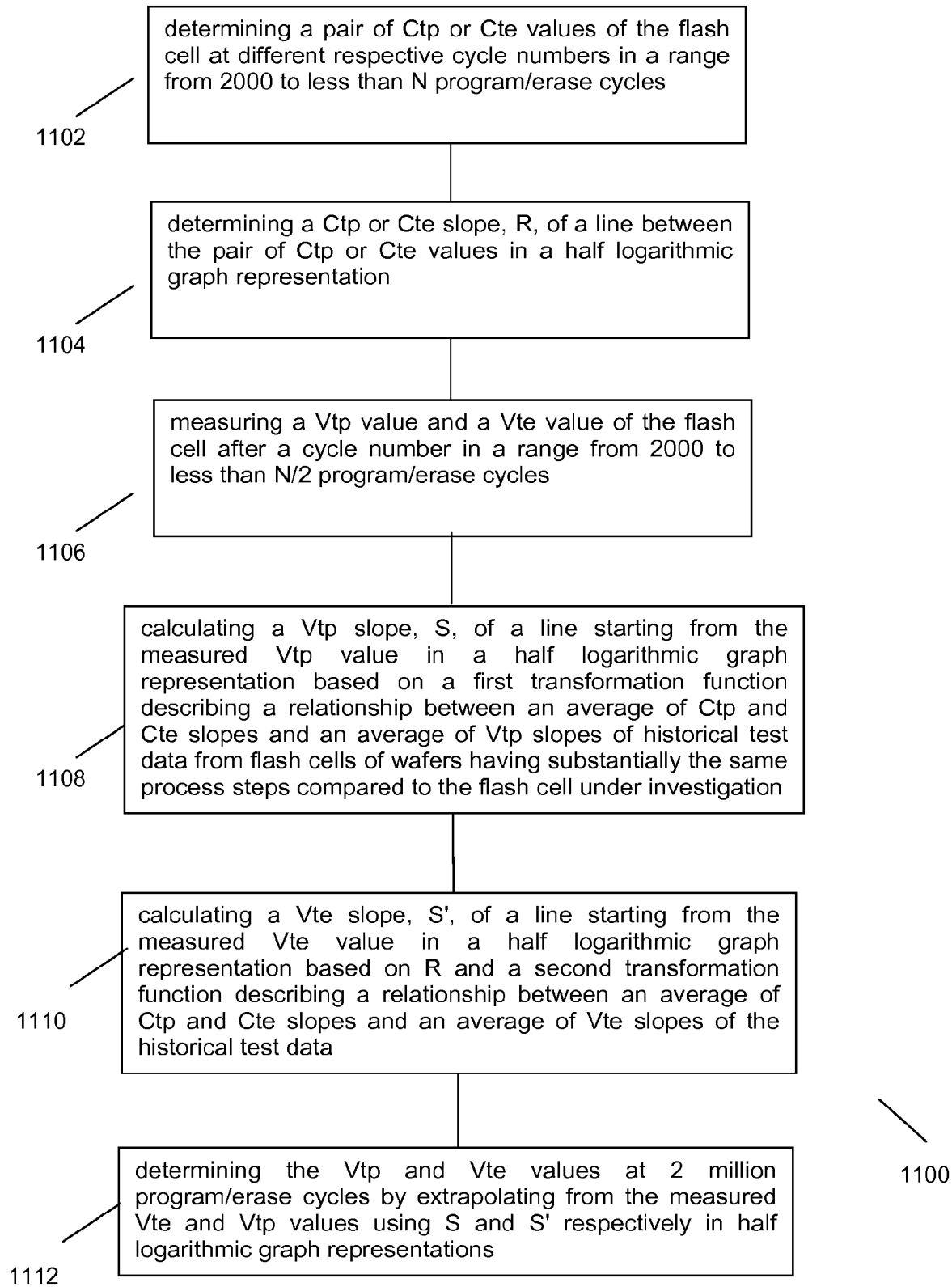
FIG. 11 shows a flow chart illustrating a method of determining a predicted flash endurance Vt of a flash cell after N program/erase cycles.

FIG. 11 shows a flow chart 1100 illustrating a method of determining a predicted flash endurance Vt of a flash cell after N program/erase cycles. At step 1102, a pair of Ctp or Cte values of the flash cell are determined at different respective cycle numbers in a range from 2000 to less than N program/erase cycles. At step 1104, a Ctp or Cte slope, R, of a line between the pair of Ctp or Cte values in a half logarithmic graph representation is determined. At step 1106, a Vtp value and a Vte value of the flash cell are measured after a cycle number in a range from 2000 to less than N/2 program/erase cycles. At step 1108, a Vtp slope, S, of a line starting from the measured Vtp value in a half logarithmic graph representation is calculated based on a first transformation function describing a relationship between an average of Ctp and Cte slopes and an average of Vtp slopes of historical test data from flash cells of wafers having substantially the same process steps compared to the flash cell under investigation. At step 1110, a Vte slope, S', of a line starting from the measured Vte value in a half logarithmic graph representation is calculated based on R and a second transformation function describing a relationship between an average of Ctp and Cte slopes and an average of Vte slopes of the historical test data. At step 1112, the Vtp and Vte values at 2 million program/erase cycles are determined by extrapolating from the measured Vte and Vtp values using S and S' respectively in half logarithmic graph representations.

Figure 12:
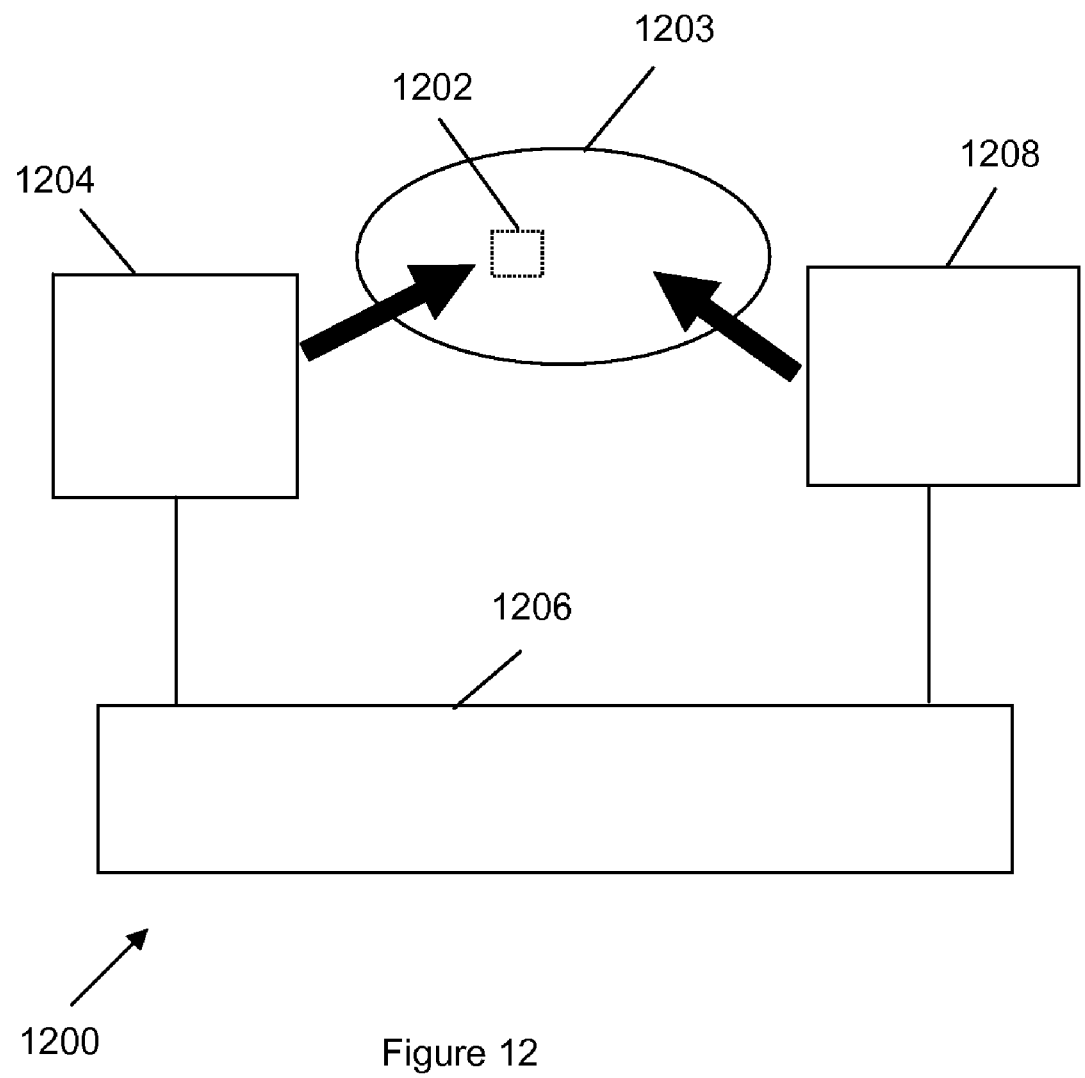
FIG. 12 shows a schematic drawing illustrating a system for determining a predicted flash endurance Vt of a flash cell after N program/erase cycles.

FIG. 12 shows a schematic drawing illustrating a system 1200 for determining a predicted flash endurance Vt of a flash cell 1202 after N program/erase cycles. The system 1200 comprises a first measurement unit 1204 for determining a pair of Ctp or Cte values of the flash cell 1202 on a wafer 1203 at different respective cycle numbers in a range from 2000 to less than N program/erase cycles. The system 1200 further comprises a processing unit 1206 coupled to the first measurement unit 1204 for determining a Ctp or Cte slope, R, of a line between the pair of Ctp or CTe values in a half logarithmic graph representation. The system 1200 further comprises a second measurement unit 1208 for measuring a Vtp value and a Vte value of the flash cell 1202 after a cycle number in a range from 2000 to less than N/2 program/erase cycles.

The processing unit 1206 is coupled to the second measurement unit 1208 and calculates a Vtp slope, S, of a line starting from the measured Vtp value in a half logarithmic graph representation based on a first transformation function describing a relationship between an average of Ctp and Cte slopes and an average of Vtp slopes of historical test data from flash cells of wafers having substantially the same process steps compared to the flash cell under investigation. The processing unit 1206 further calculates a Vte slope, S', of a line starting from the measured Vte value in a half logarithmic graph representation based on R and a second transformation function describing a relationship between an average of Ctp and Cte slopes and an average of Vte slopes of the historical test data. The processing unit 1206 further determines the Vtp and Vte values at 2 million program/erase cycles by extrapolating from the measured Vte and Vtp values using S and S' respectively in half logarithmic graph representations.

Figure 13:
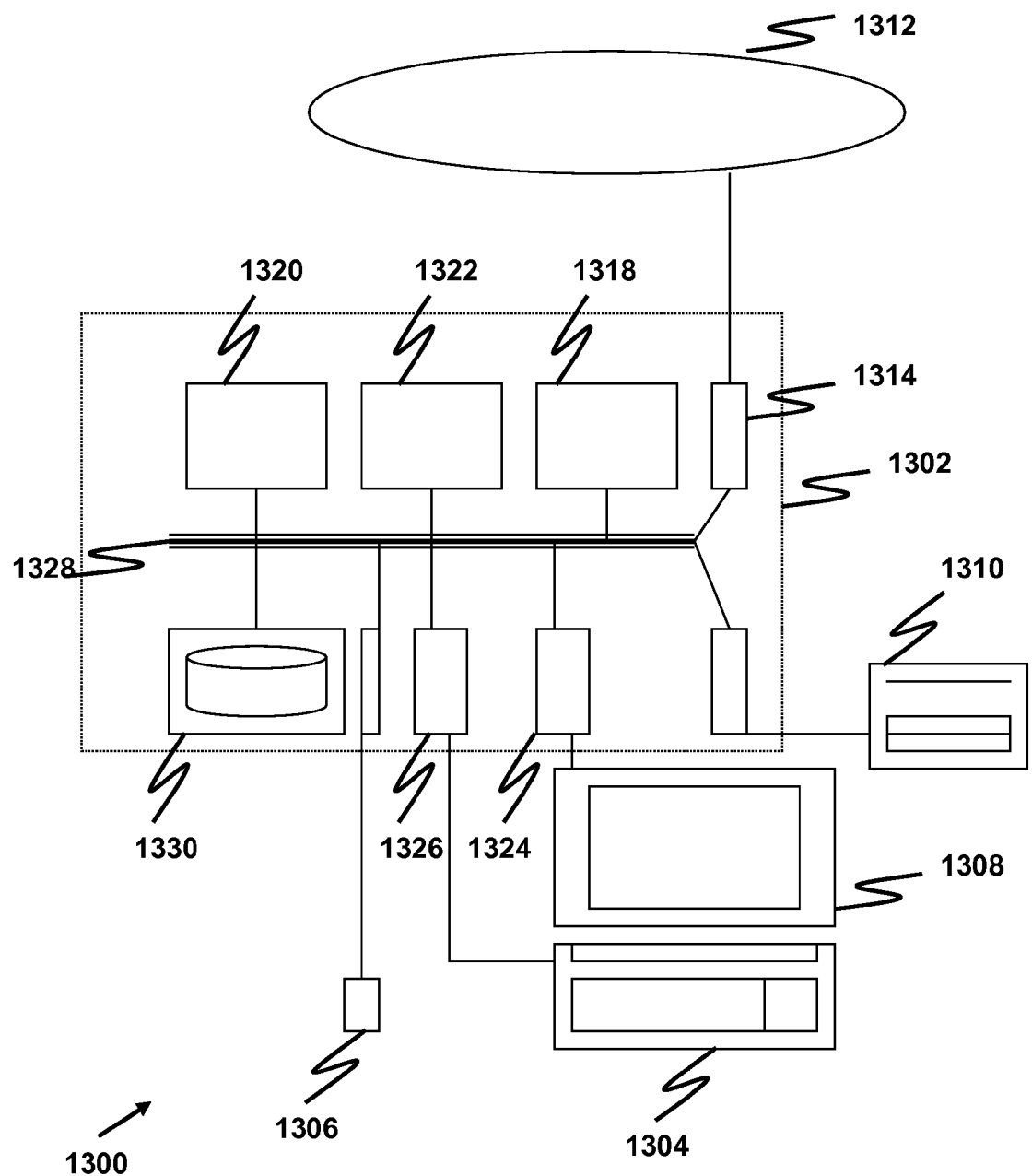
FIG. 13 shows a schematic drawing of a computer system for implementing the method and system of the described assessment technique.

The method and system of the example embodiment can be implemented on a computer system 1300, schematically shown in FIG. 13. It may be implemented etc. as software, such as a computer program being executed within the computer system 1300, and instructing the computer system 1300 to conduct the method of the example embodiment.

The computer system 1300 comprises a computer module 1302, input modules such as a keyboard 1304 and mouse 1106 and a plurality of output devices such as a display 1308, and printer 1310.

The computer module 1302 is connected to a computer network 1312 via a suitable transceiver device 1314, to enable access to e.g. the Internet or other network systems such as Local Area Network (LAN) or Wide Area Network (WAN).

The computer module 1302 in the example includes a processor 1318, a Random Access Memory (RAM) 1320 and a Read Only Memory (ROM) 1322. The computer module 1302 also includes a number of Input/Output (I/O) interfaces, for example I/O interface 1324 to the display 1308, and I/O interface 1326 to the keyboard 1304.

The components of the computer module 1302 typically communicate via an interconnected bus 1328 and in a manner known to the person skilled in the relevant art.

The application program is typically supplied to the user of the computer system 1300 encoded on a data storage medium such as a CD-ROM or flash memory carrier and read utilizing a corresponding data storage medium drive of a data storage device 1330. The application program is read and controlled in its execution by the processor 1318. Intermediate storage of program data may be accomplished using RAM 1320.

It will be appreciated by a person skilled in the art that numerous variations and/or modifications may be made to the present invention as shown in the specific embodiments without departing from the spirit or scope of the invention as broadly described. The present embodiments are, therefore, to be considered in all respects to be illustrative and not restrictive.

The invention claimed is:

1. A method of determining a predicted flash endurance Vt of a flash cell after N program/erase cycles, the method comprising the steps of:
    determining a pair of Ctp or Cte values of the flash cell at different respective cycle numbers in a range from 2000 to less than N program/erase cycles;
    determining a Ctp or Cte slope, R, of a line between the pair of Ctp or Cte values in a half logarithmic graph representation;
    measuring a Vtp value and a Vte value of the flash cell after a cycle number in a range from 2000 to less than N/2 program/erase cycles;
    calculating a Vtp slope, S, of a line starting from the measured Vtp value in a half logarithmic graph representation based on a first transformation function describing a relationship between an average of Ctp and Cte slopes and an average of Vtp slopes of historical test data from flash cells of wafers having substantially the same process steps compared to the flash cell under investigation;
    calculating a Vte slope, S', of a line starting from the measured Vte value in a half logarithmic graph representation based on R and a second transformation function describing a relationship between an average of Ctp and Cte slopes and an average of Vte slopes of the historical test data; and
    determining the Vtp and Vte values at 2 million program/erase cycles by extrapolating from the measured Vte and Vtp values using S and S' respectively in half logarithmic graph representations.

2. The method as claimed in claim 1, wherein the step of determining the pair of Ctp or Cte values of the flash cell comprises measuring Icp_e or Icp_p respectively as a function of Vbase of the flash cell.

3. The method as claimed in claim 2, wherein the step of determining the Ctp or Cte slope, R, comprises using a first logarithmic function and substituting the measured pair of Ctp or Cte values to calculate parameters of the first logarithmic function.

4. The method as claimed in claim 1, wherein the step of determining the Vtp and Vte values comprises:
    using a second logarithmic function and substituting the calculated S and the measured Vtp to calculate parameters of the second logarithmic function; and
    using a third logarithmic function and substituting the calculated S' and the measured Vte to calculate parameters of the second logarithmic function.

5. The method as claimed in claim 1, wherein the first transformation function comprises a ratio of the average of the Ctp and Cte slopes and the average of the Vtp slopes of historical test data, and the second transformation function comprises a ratio of the average of the Ctp and Cte slopes and the average of the Vte slopes of historical test data.

6. A system for determining a predicted flash endurance Vt of a flash cell after N program/erase cycles, the system comprising:
    a first measurement unit for determining a pair of Ctp or Cte values of the flash cell at different respective cycle numbers in a range from 2000 to less than N program/erase cycles;
    a processing unit for determining a Ctp or Cte slope, R, of a line between the pair of Ctp or CTe values in a half logarithmic graph representation;
    a second measurement unit for measuring a Vtp value and a Vte value of the flash cell after a cycle number in a range from 2000 to less than N/2 program/erase cycles;
    wherein the processing unit calculates a Vtp slope, S, of a line starting from the measured Vtp value in a half logarithmic graph representation based on a first transformation function describing a relationship between an average of Ctp and Cte slopes and an average of Vtp slopes of historical test data from flash cells of wafers having substantially the same process steps compared to the flash cell under investigation; calculates a Vte slope, S', of a line starting from the measured Vte value in a half logarithmic graph representation based on R and a second transformation function describing a relationship between an average of Ctp and Cte slopes and an average of Vte slopes of the historical test data; and determines the Vtp and Vte values at 2 million program/erase cycles by extrapolating from the measured Vte and Vtp values using S and S' respectively in half logarithmic graph representations.

7. The system as claimed in claim 6, wherein the first measurement unit measures Icp_e or Icp_p respectively as a function of Vbase of the flash cell.

8. The system as claimed in claim 7, wherein the processing unit, in determining the Ctp or Cte slope, R, uses a first logarithmic function and substituting the measured pair of Ctp or Cte values to calculate parameters of the first logarithmic function.

9. The system as claimed in claim 6, wherein the processing unit, in determining the Vtp and Vte values, uses a second logarithmic function and substituting the calculated S and the measured Vtp to calculate parameters of the second logarithmic function; and uses a third logarithmic function and substituting the calculated S' and the measured Vte to calculate parameters of the second logarithmic function.

10. The system as claimed in claim 6, wherein the first transformation function comprises a ratio of the average of the Ctp and Cte slopes and the average of the Vtp slopes of historical test data, and the second transformation function comprises a ratio of the average of the Ctp and Cte slopes and the average of the Vte slopes of historical test data.

11. A data storage medium having stored thereon computer code means for instructing a computer to execute a method of determining a predicted flash endurance Vt of a flash cell after N program/erase cycles, the method comprising the steps of:

determining a pair of Ctp or Cte values of the flash cell at different respective cycle numbers in a range from 2000 to less than N program/erase cycles;

determining a Ctp or Cte slope, R, of a line between the pair of Ctp or CTe values in a half logarithmic graph representation;

measuring a Vtp value and a Vte value of the flash cell after a cycle number in a range from 2000 to less than N/2 program/erase cycles;

calculating a Vtp slope, S, of a line starting from the measured Vtp value in a half logarithmic graph representation based on a first transformation function describing a relationship between an average of Ctp and Cte slopes and an average of Vtp slopes of historical test data from flash cells of wafers having substantially the same process steps compared to the flash cell under investigation;

calculating a Vte slope, S', of a line starting from the measured Vte value in a half logarithmic graph representation based on R and a second transformation function describing a relationship between an average of Ctp and Cte slopes and an average of Vte slopes of the historical test data; and determining the Vtp and Vte values at 2 million program/erase cycles by extrapolating from the measured Vte and Vtp values using S and S respectively in half logarithmic graph representations.

* * * * *